(12) United States Patent
Grellner et al.

(10) Patent No.: US 6,348,419 B1
(45) Date of Patent: Feb. 19, 2002

(54) MODIFICATION OF THE WET CHARACTERISTICS OF DEPOSITED LAYERS AND IN-LINE CONTROL

(75) Inventors: Frank Grellner, Fishkill; Paul C. Jamison, Hopewell Junction, both of NY (US); Glen L. Miles, Essex Junction; David C. Mosher, Colchester, both of VT (US); Emmanuel Batt, Millau (FR)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/375,763

(22) Filed: Aug. 18, 1999

(51) Int. Cl.$^7$ ............................................. H01L 21/302
(52) U.S. Cl. ...................... 438/753; 438/756; 438/757
(58) Field of Search ................. 438/706, 724, 438/745, 747, 756, 757, 778, 769, 753, 755

(56) References Cited

U.S. PATENT DOCUMENTS

| | | | | |
|---|---|---|---|---|
| 4,563,367 A | * | 1/1986 | Sherman | 438/723 |
| 5,134,092 A | * | 7/1992 | Matsumoto et al. | 438/674 |
| 5,468,689 A | * | 11/1995 | Cunningham et al. | 438/479 |
| 5,539,154 A | * | 7/1996 | Nguyen et al. | 174/138 C |

* cited by examiner

Primary Examiner—Benjamin L. Utech
Assistant Examiner—Binh X. Tran

(57) ABSTRACT

A method for adjusting an etch rate of a nitride layer, in accordance with the present invention includes, in a reaction chamber, providing a surface for depositing a nitride layer. The nitride layer is deposited on the surface by adjusting processing parameters to control an etch rate achievable for the nitride layer. The etch rate achievable results from the depositing step such that an ability to etch the nitride layer is determined by the adjustment of the process parameters. A refractive index measurement may be provided for monitoring the achievable etch rate for the nitride layer.

20 Claims, 2 Drawing Sheets

US 6,348,419 B1

MODIFICATION OF THE WET CHARACTERISTICS OF DEPOSITED LAYERS AND IN-LINE CONTROL

BACKGROUND

1. Technical Field

This disclosure relates to semiconductor fabrication and more particularly, to a method for reducing an etch rate of deposited layers for semiconductor devices.

2. Description of the Related Art

Semiconductor processes typically employ deposition processes and etching process to introduce and remove materials. In many instances, these processes may be employed without disrupting other structures or components previously formed. In other instances, protective layers are patterned to protect previously formed components from, for example, etching processes which may damage the previously formed components. These protective layers or blocking layers are employed in silicided junction formation for logic devices. The blocking layers prevent silicide formation on devices such as resistors which would be negatively affected by the deposition of a silicide thereon. Other applications include protection of devices or components from electrostatic discharge by employing the blocking layer.

Existing processes for forming blocking layers typically employ either low pressure chemical vapor deposited (LPCVD) nitride, thick plasma enhanced chemical vapor deposited (PECVD) nitride, or densified PECVD nitride, all of which experience process integration problems.

LPCVD nitride films have a high thermal budget which affects the device behavior. As is known in the art, high thermal budgets are typically not preferred for semiconductor fabrication processes as the often degrade device performance due to annealing and mass transport phenomenon.

Further, removing a thick PECVD nitride layer reduces the process margin for such things as gate to diffusion shorts in field effect transistors. This is due to etch processes which are typically applied to standard logic devices which recess spacers formed on sidewalls of the gate structure thereby reducing the insulation between the gate and the diffusion region (e.g., source or drain regions). Typically, conventional PECVD nitride films have either a fast etch rate in HF cleaning solutions or a fast deposition rate that requires a higher deposition thickness.

One attempt at addressing the fast etch rate in HF cleaning solutions and the fast deposition rate involves a densification process. There are primarily two potential drawbacks to densification of PECVD nitride to obtain a better wet etch rate. Both drawbacks are due to the large amount of $H_2$ in PECVD films. First, a device beneath the PECVD layer is in effect receiving a $H_2$ anneal during the densification. Boron diffusion through gate oxides are facilitated by $H_2$ annealing. This puts P-type field effect transistors (FETs) at risk for threshold voltage (Vt) shifts. Secondly, if there is excess $H_2$ gas evolution during the anneal, the nitride may blister or pop. This makes densification processes risky and difficult to employ.

Therefore, a need exists for a method of providing a blocking layer which resists etching without requiring densification. The blocking layer preferably includes a PECVD nitride blocking layer which is deposited with a relatively low thermal budget.

SUMMARY OF THE INVENTION

A method for adjusting an etch rate of a nitride layer, in accordance with the present invention includes, in a reaction chamber, providing a surface for depositing a nitride layer. The nitride layer is deposited on the surface by adjusting processing parameters to control an etch rate achievable for the nitride layer. The etch rate achievable results from the depositing step such that an ability to etch the nitride layer is determined by the adjustment of the process parameters. A refractive index measurement may be provided for monitoring the achievable etch rate for the nitride layer.

In other methods, the step of adjusting may include the step of adjusting a pressure in the reaction chamber. The step of adjusting may include the step of adjusting a flow rate of deposition gases. The deposition gases may include $SiH_4$ and $NH_3$. The step of adjusting may also include the step of reducing a pressure in the reaction chamber to decrease the etch rate of the nitride layer. The deposition rate is preferably substantially maintained by reducing the pressure. The ability to etch the nitride layer may be measured by measuring an index of refraction of the nitride layer. The step of adjusting may include the step of adjusting the process parameters by employing a refractive index as feedback to provide an etch rate for the nitride layer. The step of depositing the nitride layer may include employing a plasma enhanced chemical vapor deposition process.

A method for adjusting an etch rate of a blocking layer in semiconductor fabrication processes includes, in a reaction chamber, providing a semiconductor device having components formed thereon, a portion of the components needing protection by a blocking layer. The blocking layer is deposited on the semiconductor device by plasma enhanced chemical vapor deposition of nitride. A pressure in the reaction chamber is adjusted for the depositing step to control an etch rate achievable for the nitride such that an ability to etch the nitride is determined by the magnitude of the pressure during the depositing step.

In other methods, the step of adjusting may include the step of adjusting a flow rate of deposition gases. The deposition gases may include at least one of $SiH_4$ and $NH_3$. The step of adjusting may include the step of reducing a pressure in the reaction chamber to decrease the etch rate achievable for the nitride. The deposition rate is preferably substantially maintained by reducing the pressure. The etch rate achievable for the nitride may be measured by measuring an index of refraction of the nitride. The step of adjusting includes the step of adjusting the pressure by employing a refractive index as feedback to provide an achievable etch rate for the nitride may be included.

The method may further includes the step of removing the blocking layer from portions of the semiconductor device other than from the portion of the components needing protection by the blocking layer. The method may also include cleaning the semiconductor device by wet etching such that the nitride is etched at the etch rate provided during the deposition step. The wet etching may include employing at least one of HF, diluted HF and buffered HF. The step of siliciding the semiconductor device in portions other than the portion of the components needing protection by the blocking layer is also included.

Another method for adjusting an etch rate of a deposited layer, includes, in a reaction chamber, providing a surface for depositing a layer, depositing the layer on the surface, and adjusting processing parameters for the depositing step to control an achievable etch rate for the layer by measuring a refractive index of the layer such that an ability to etch the layer is determined by the adjusting of the process parameters in accordance with the refractive index.

In other methods, the step of adjusting may include the step of adjusting a pressure in the reaction chamber, and/or adjusting a flow rate of deposition gases. The deposition gases may include at least one of $SiH_4$ and $NH_3$. The step of adjusting may include the step of reducing a pressure in the reaction chamber to decrease the etch rate of the layer. The deposition rate may be substantially maintained by reducing the pressure. The layer may include nitride. The nitride layer is preferably deposited by a plasma enhanced chemical vapor deposition process.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The invention teaches methods for altering etch rate properties of deposited layers, for example, PECVD nitride layers. In preferred methods, etching rates, preferably wet etch rates employing HF solutions, are tailored for silicide blocking by modifying the deposition parameters of the PECVD nitride. Control of the wet etch rate is achieved, inter alia, by altering the deposition pressure and/or gas concentration. These parameters may also be used to adjust the deposition rate of the PECVD nitride layer or films which also controls thickness. A refractive index measurement is advantageously employed to provide in-line monitoring measurements for predicting and controlling the etch rate achievable for the PECVD layer.

The present invention will be described in terms of a silicide blocking layer for semiconductor logic device fabrication. However, the invention is broader and is applicable to any layer deposition where a lower etch rate is desired. The present invention is presented in terms of PECVD processing of nitride; however, other processes and materials may be employed. For example, other materials may be grown by different processes while monitoring refractive index to determine achievable etch rates for the resultant layer. The present disclosure will describe etch rates relative to a standard wet etch of 100 □ of thermal oxide (silicon oxide). This standard gives a normalized comparison metric for comparing different etch rates under different conditions. In one embodiment of the present invention, PECVD nitride is employed as a silicide blocking layer in a so-called OP process. The blocking layer is able to withstand a salicide preclean which is a precleaning process employed before salicide formation for logic devices. Precleaning removes a substantial amount of native oxide to achieve reliable silicide formation on the devices. The amount of native oxide removed, for example, can be between about 50 Å to about 200 Å of thermal oxide. In accordance with the invention, PECVD nitride is preferred to LPCVD nitride because the thermal budget of a LPCVD film is larger. PECVD nitrides, however tend to have fast etch rates in HF solutions. The fast etch rates cannot be compensated simply by depositing a thicker film because the OP nitride is removed from the standard logic devices preferably by a reactive ion etch (RIE) process and the removal of a thick film will tend to cause pull down of the device spacers which will cause gate to diffusion shorts as described above.

Figure 1:
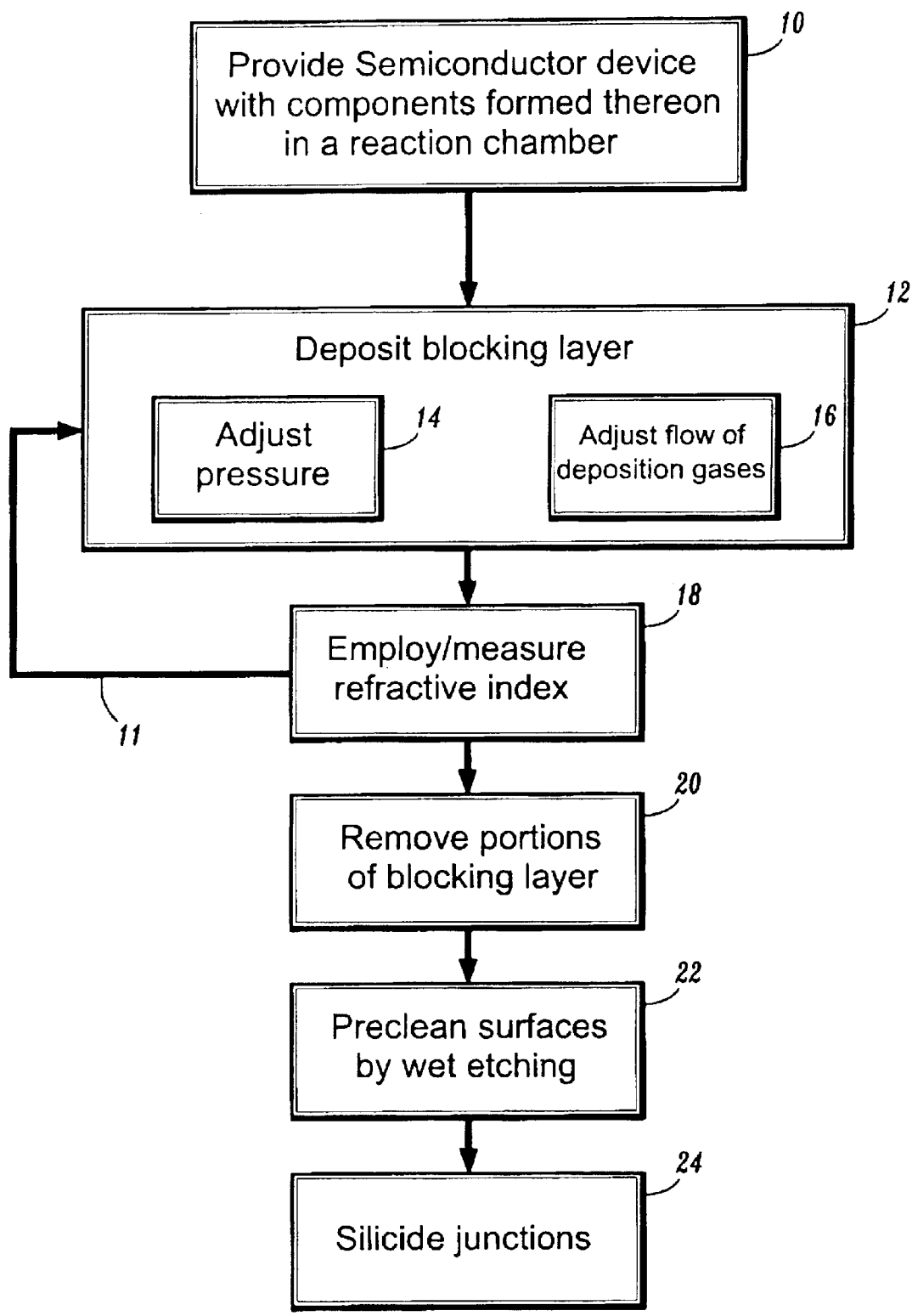
FIG. 1 is a flow diagram showing a method for modifying etch characteristics of a nitride layer in accordance with the present invention.

Referring now in specific detail to the drawings in which like reference numerals identify similar or identical elements throughout the several views, and initially to FIG. 1, a flow diagram for a method for modification of the wet etch characteristics of PECVD nitride for silicide blocking is shown. In block 10, devices or components are formed on a semiconductor device. Some of these components, for example, resistors, are preferably blocked by depositing a blocking layer. In block 12, a blocking layer is deposited over the entire semiconductor device. The blocking layer provides protection for the resistors to prevent degradation of performance due to later processing, such as siliciding.

In block 12, the blocking layer is deposited in accordance with the present invention. By altering the process parameters, such as, deposition pressure and gas flows, improvements to a wet etch rate are achieved without significantly increasing the deposition rate of the PECVD nitride layer. By adjusting the pressure, in block 14, in reaction chamber (preferably a PECVD reaction chamber), wet etch rates are capable of being controlled to provide desirable characteristics. For example, reducing the pressure in a PECVD chamber for a PECVD nitride layer provides an increased deposition rate. This pressure reduction also decreases a wet etch rate. The wet etch may include an HF etch, diluted HF or buffered HF etch. Other wet etchants may also be employed. Pressures employed in a PECVD chamber may include pressures of between about 3 and 6 Torr, for PECVD deposition. Advantageously, pressure reductions of only between 5 Torr and about 1 Torr or less may be employed to achieve significant reduction in wet etch rates for the nitride layer.

In block 16, the flow rate of constituent gases may be adjusted to achieve a desired deposition rate and wet etch rate. Constituents may include at least one of $SiH_4$, $NH_3$, etc. for the formation of the nitride layer. Flow rates of $SiH_4$ may be adjusted between about 20 to about 100 sccm at temperatures of between about 450 and about 525 degrees Celsius. Flow rates of $NH_3$ may be adjusted between about 5 to about 25 sccm at temperatures of between about 450 and about 525 degrees Celsius.

The methods of the present invention may include one or both of blocks 14 and 16. The pressure adjustment of block 14 provides a surprising and significant result. The wet etch rate increases at a rapid rate while only slightly affecting the deposition rate for the process. The deposition rate is substantially maintained. The pressure effect provides several useful characteristics, which include: densification of the nitride layer is avoided, deposition rate of the nitride is maintained at about the same level and wet etch rates are significantly reduced. The nitride layer formed in accordance with the present invention also reduces thermal budget since a PECVD nitride is preferably used, although a LPCVD or other process may also be employed.

In block 18, the wet etch rates of the nitride layer are advantageously predictable based on the refractive index of the layer. The refractive index is preferably measured during deposition. Advantageously, the refractive index of the PECVD nitride layer may be employed as a control parameter for predicting the wet etch rate. In one embodiment, the refractive index can be employed as a feedback parameter for adjusting the pressure (or flow rates) during the deposition of the PECVD nitride layer. A feedback loop 11 returns the process path to block 12 where adjustments may be made to the process parameters, in accordance with the invention. Refractive index is correlated to etch rates such that feedback loop 11 provides adjustment information.

Figure 2:
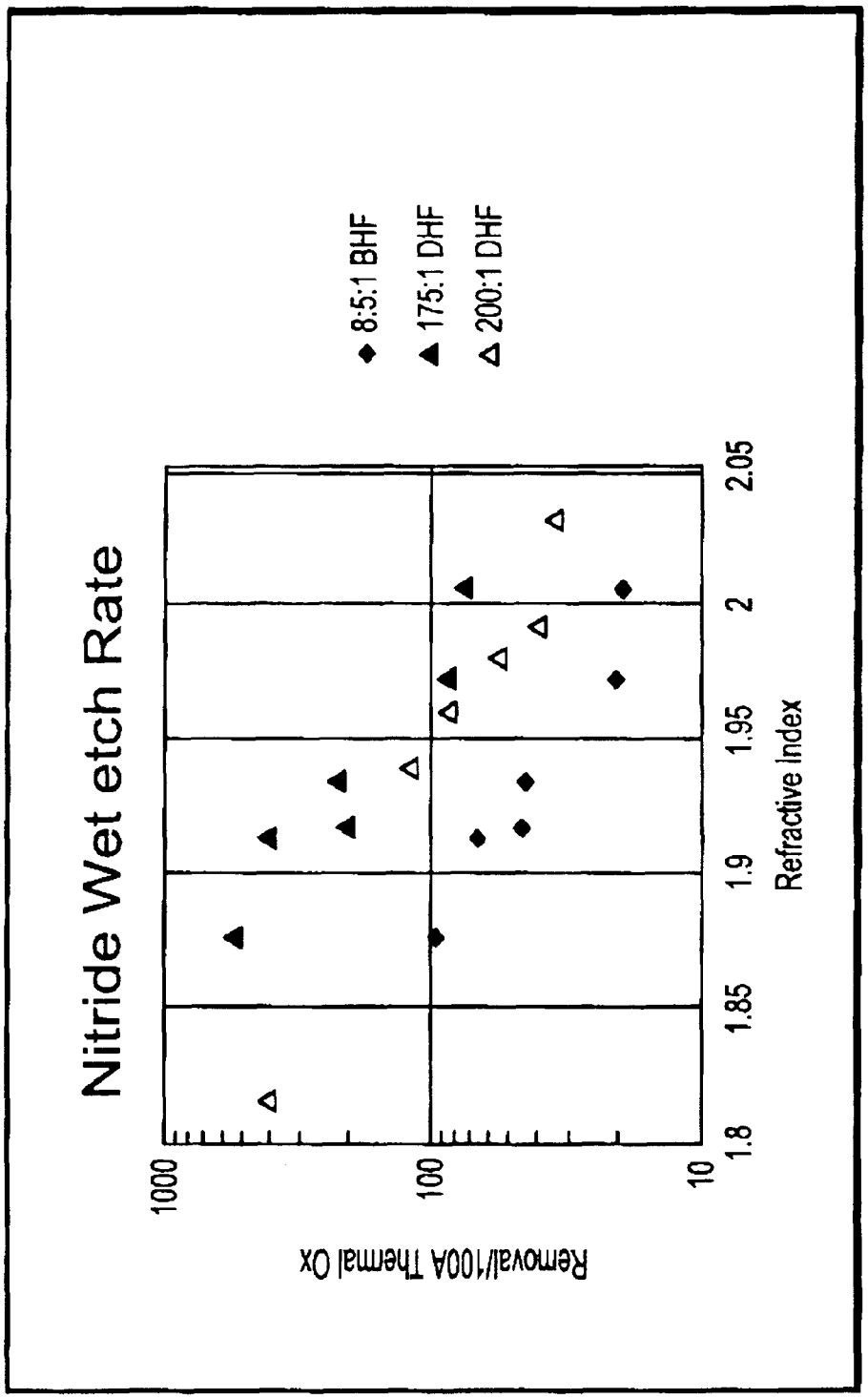
FIG. 2 is a graph illustratively showing a correlation between etch rates and refractive index in accordance with the present invention.

Referring to FIG. 2, an illustrative graph shows the correlation between wet etch rates (employing the 100 Å thermal oxide standard) for PECVD nitride and refractive indices for different HF etch solutions. By employing a correlation as illustratively shown, etch rates for a deposited nitride layer may be predicted or employed to adjust the deposition process based on refractive index in accordance with the present invention.

Referring again to FIG. 1, in block 20, the blocking layer (e.g., PECVD nitride) is removed from portions of the semiconductor device not including the components needing the blocking layer. For example, the blocking layer may remain on resistors or components needing electrostatic discharge protection. In block 22, a preclean process is employed to preclean the semiconductor device to remove native oxide. The wet etch rates in accordance with the present invention provide sufficient etch resistance to remain thick enough on the components or elements for which the nitride layer, as a blocking layer, is deposited to protect. In block 24, the silicide process forms silicide on the semiconductor device. For example, the silicide is employed for the fabrication of transistors. The siliciding process may include employing cobalt silicide, for example.

Experiments have been performed by the inventors. The optimum film or layer includes both low wet etch rates (for example, between about 0 Å and about 60 Å of thermal or native oxide equivalent etch depth) as well as a low deposition rate (preferably less than about 20 Å/sec). Data for an illustrative experiment is summarized in Table 1 in which the wet etch rates have been normalized to the removal of 100 Å of thermal oxide:

TABLE 1

| Temp [C] | $SiH_4$ flow [sccm] | $NH_3$ flow [sccm] | Pressure [Torr] | RI | Wet etch rate 1 | Wet etch rate 2 | Dep. Rate Å/sec |
|---|---|---|---|---|---|---|---|
| 480 | 60 | 15 | 5.75 | 1.973 | 21.3 | 58.0 | 33.5 |
| 480 | 60 | 15 | 4.75 | NA | NA | 53.0 | NA |
| 480 | 60 | 15 | 3.25 | 2.03 | NA | 36.0 | 36.2 |
| 480 | 28 | 7 | 5.75 | 1.876 | 97.1 | 260 | 13.3 |
| 480 | 28 | 7 | 4.75 | 1.912 | 67.8 | 200 | 15.4 |
| 480 | 28 | 7 | 4.0 | 1.933 | 44.7 | NA | 19.2 |

RI is the refractive index measured for the layer. Wet etch rate 1 includes wet etching with buffered HF (8:5:1) and wet etch rate 2 includes wet etching with diluted HF (200:1). NA means the data was not available. A gap spacing in the PECVD chamber was 375 mm for all measurements in Table 1. As indicated by the data, reducing the flow of the gases lowers the deposition rate but also reduce the etch rate. Advantageously, reducing the pressure improves the etch rate and only increases the deposition rate slightly.

It is to be understood the present invention has been illustratively described in terms of PECVD nitride; however other processes may be employed for which the refractive index is employed to determine the etch rate of the resultant layer. For example, an oxide layer or a polysilicon layer may be deposited having deposition parameters adjusted according to feedback from a refractive index measurement. Other processes, for example, LPCVD or CVD may be employed in which the refractive index measurement may be employed in accordance with the invention.

Having described preferred embodiments for a novel modification of the wet etch characteristics of PECVD nitride for silicide blocking and in-line control (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for adjusting etch characteristics of a nitride layer, comprising the steps of:

in a reaction chamber, providing a surface for depositing a nitride layer;

depositing the nitride layer on the surface; and adjusting processing parameters including at least one of flow rate of deposition gases and pressure for the depositing step while maintaining a substantially constant deposition rate for the nitride layer, such that the refractive index of the nitride layer is measured and the step of adjusting includes the step of adjusting the processing parameters by employing the refractive index as feedback to provide an etch rate for the nitride layer.

2. The method as recited in claim 1, wherein the deposition gases include at least one of $SiH_4$ and $NH_3$.

3. The method as recited in claim 1, wherein the step of depositing the nitride layer includes employing a plasma enhanced chemical vapor deposition process.

4. The method as recited in claim 1, wherein the step of adjusting includes the step of reducing the pressure in the reaction chamber to decrease the etch rate of the nitride layer.

5. The method as recited in claim 4, wherein the deposition rate is substantially maintained by reducing the pressure.

6. A method for adjusting etch characteristics of a blocking layer in semiconductor fabrication processes, comprising the steps of:

in a reaction chamber, providing a semiconductor device having components formed thereon, a portion of the components needing protection by a blocking layer;

depositing the blocking layer on the semiconductor device by plasma enhanced chemical vapor deposition of nitride; and adjusting pressure in the reaction chamber for the depositing step while maintaining a substantially constant deposition rate for the nitride; determining the magnitude of the pressure during the depositing step, measuring a refractive index of the nitride, wherein the step of adjusting includes the step of adjusting the pressure by employing the refractive index as feedback to provide an etch rate for the nitride.

7. The method as recited in claim 6, wherein the step of adjusting further includes the step of adjusting a flow rate of deposition gases.

8. The method as recited in claim 7, wherein the deposition gases include at least one of $SiH_4$ and $NH_3$.

9. The method as recited in claim 6, wherein the step of adjusting includes the step of reducing the pressure in the reaction chamber to decrease the etch rate for the nitride.

10. The method as recited in claim 9, wherein the deposition rate is substantially maintained by reducing the pressure.

11. The method as recited in claim 6, further comprising the step of:

removing the blocking layer from portions of the semiconductor device other than from the portion of the components needing protection by the blocking layer.

12. The method as recited in claim 11, further comprising the step of:

siliciding the semiconductor device in portions other than the portion of the components needing protection by the blocking layer.

13. The method as recited in claim 11, further comprising the step of:

cleaning the semiconductor device by wet etching such that the nitride is etched at the etch rate provided during the deposition step.

14. The method as recited in claim 13, wherein the wet etching includes employing at least one of HF, diluted HF and buffered HF.

15. A method for adjusting etch characteristics of a deposited layer, comprising the steps of:

in a reaction chamber, providing a surface for depositing a layer;

depositing the layer on the surface; and adjusting processing parameters including at least one of flow rate of deposition gases and pressure for the depositing step while maintaining a substantially constant deposition rate for the nitride layer to provide etch characteristics for the nitride layer by measuring a refractive index of the nitride layer and adjusting of the processing parameters in accordance with the refractive index.

16. The method as recited in claim 15, wherein the deposition gases include at least one of $SiH_4$ and $NH_3$.

17. The method as recited in claim 15, wherein the step of adjusting includes the step of reducing the pressure in the reaction chamber to decrease an etch rate of the layer.

18. The method as recited in claim 17, wherein the deposition rate is substantially maintained by reducing the pressure.

19. The method as recited in claim 15, wherein the layer includes nitride.

20. The method as recited in claim 19, wherein the nitride layer is deposited by a plasma enhanced chemical vapor deposition process.

\* \* \* \* \*